United States Patent [19]

Flasza et al.

[11] 4,347,483
[45] Aug. 31, 1982

[54] FREQUENCY AND PHASE LOCK LOOP WITH SEPARATED AFC AND PHASE LOCKING

[75] Inventors: Michael D. Flasza, Schaumburg; Jouke N. Rypkema, Lombard, both of Ill.

[73] Assignee: Zenith Radio Corporation, Glenview, Ill.

[21] Appl. No.: 172,920

[22] Filed: Jul. 28, 1980

[51] Int. Cl.³ .............................................. H03L 7/10
[52] U.S. Cl. ........................................ 331/12; 331/25; 331/31
[58] Field of Search .................................... 331/10–12, 331/17, 18, 25, 30–32

[56] References Cited

U.S. PATENT DOCUMENTS 4,072,909  2/1978  Citta ........................................ 331/12
4,156,204  5/1979  Hargis ...................................... 331/12
4,188,589  2/1980  Brown et al. ............................ 331/12

Primary Examiner—Siegfried H. Grimm
Assistant Examiner—Edward P. Westin

[57] ABSTRACT

A frequency and phase lock loop is disclosed in which AFC and phase locking functions are completely separated thus permitting signal acquisition range and closed loop bandwidth parameters to be independently established. Interference between phase lock loop (PLL) and automatic frequency control (AFC) signals resulting in the loss of a beat frequency signal for matching VCO and reference signal frequencies is eliminated thus affording enhanced PLL frequency pull-in range.

1 Claim, 24 Drawing Figures

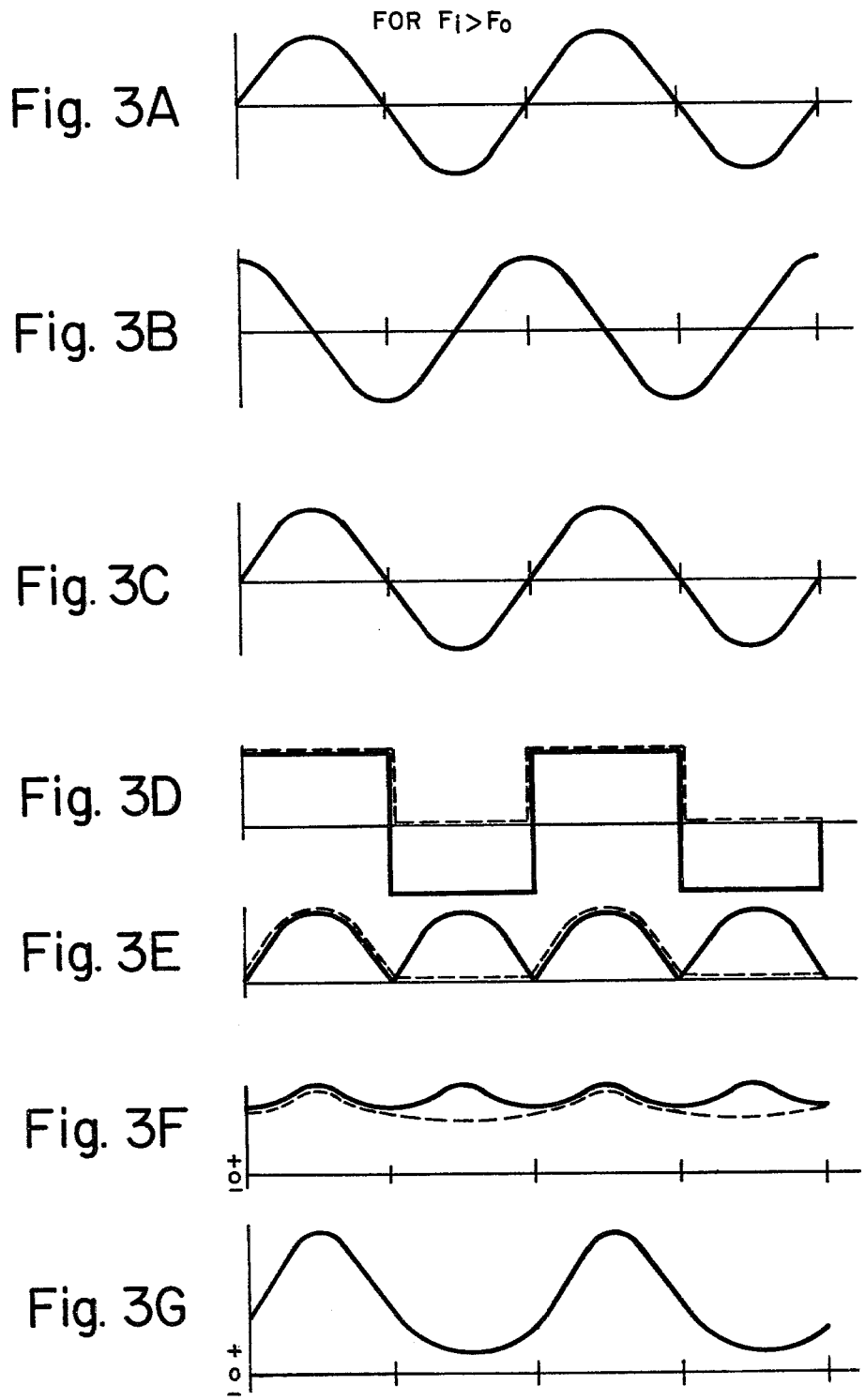

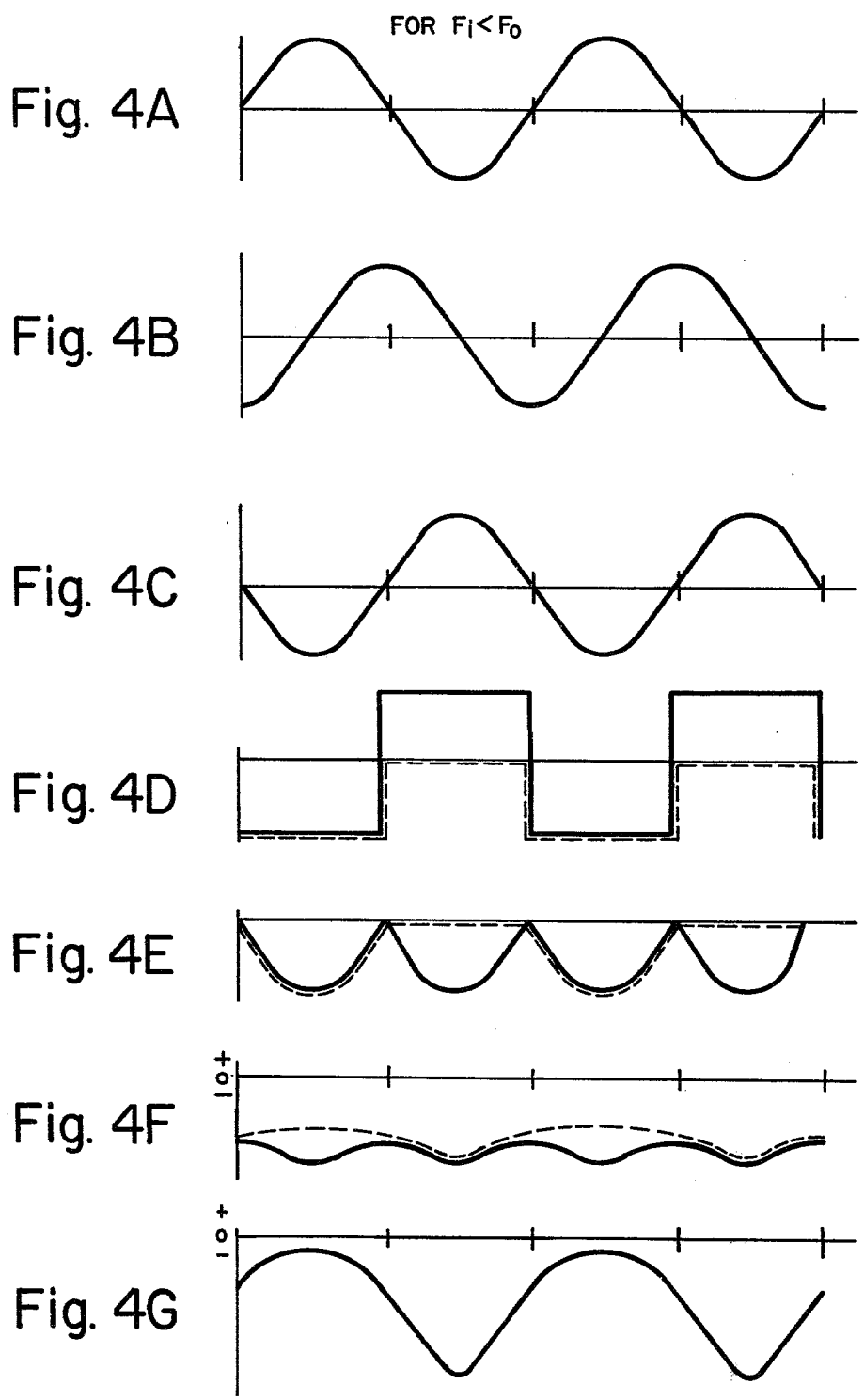

Fig. 5A INCOMING FREQUENCY
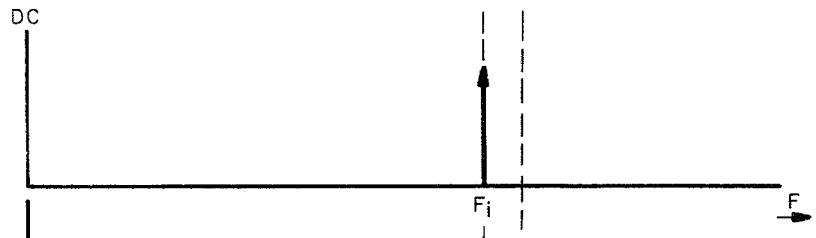
Fig. 5B OPEN LOOP VCO FREQUENCY
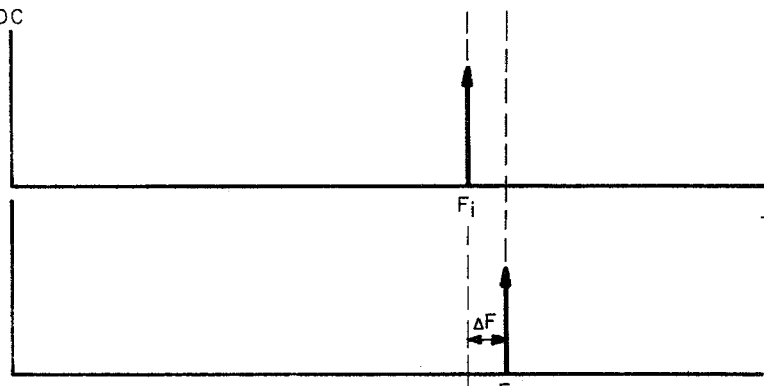
Fig. 5C OPEN LOOP BEAT AT A
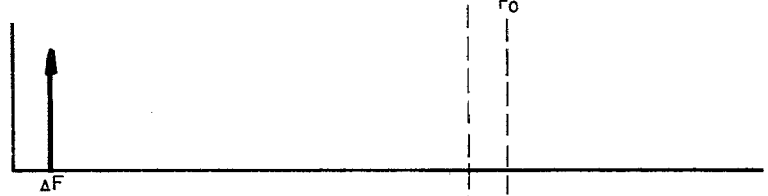
Fig. 5D OPEN LOOP BEAT AT D
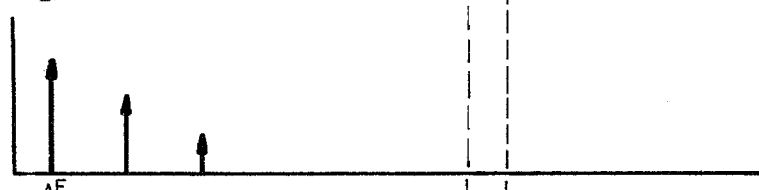
Fig. 5E OPEN LOOP BEAT AT F FOR ±1 FREQUENCY LOOP MULTIPLIER
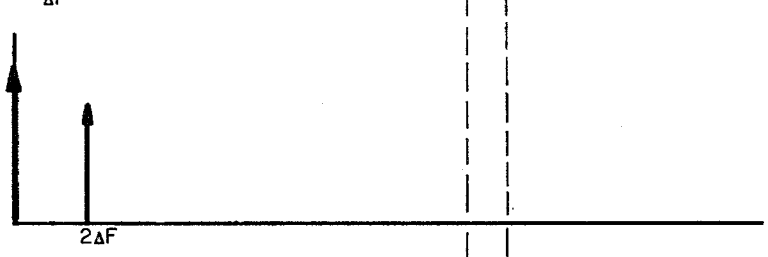
Fig. 5F INITIAL CLOSED LOOP VCO SPECTRUM FOR ±1 FREQUENCY LOOP MULTIPLIER
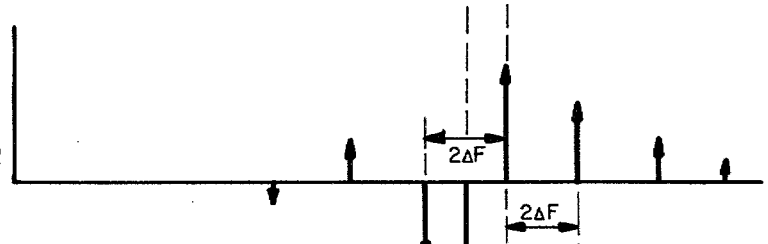
Fig. 5G OPEN LOOP BEAT AT F FOR 0-1 FREQUENCY LOOP MULTIPLIER
Fig. 5H INITIAL CLOSED LOOP VCO SPECTRUM FOR 0-1 FREQUENCY LOOP MULTIPLIER
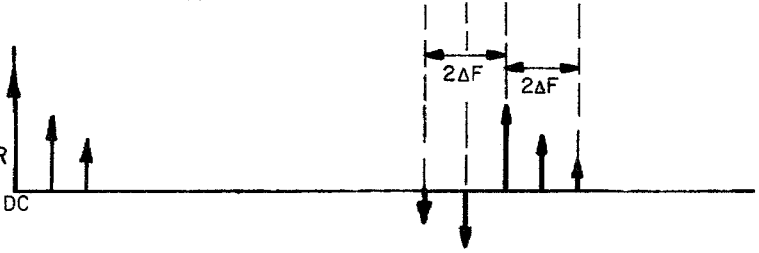

FREQUENCY AND PHASE LOCK LOOP WITH SEPARATED AFC AND PHASE LOCKING

BACKGROUND OF THE INVENTION

This invention relates generally to signal acquisition and lock-on systems, and more particularly to a frequency and phase lock loop system for receiving RF signals.

A phase lock loop (PLL) is a feed back system typically comprising a phase detector or phase comparator, a PLL filter, and a voltage controlled oscillator (VCO). The VCO output signal is applied to one input terminal of a phase or frequency comparator, with an input reference signal being provided to the other input terminal of the phase or frequency comparator. The comparator generates an error signal, in response to phase or frequency differences between the VCO output signal and the reference signal. The error signal is applied to the PLL filter, the output signals of this filter being, in turn, applied to the control input of the VCO. By means of this feedback system the oscillator frequency approaches more closely and eventually locks onto the phase of the reference input signal by virtue of the correction signal fed back to the VCO.

The typical PLL has two modes of operation: signal acquisition, or frequency pull-in, and phase lock. In the acquisition mode the VCO's frequency is not equal to the input signal frequency and the loop generates a voltage which pulls the VCO frequency toward the input signal's frequency until it locks. The level of this stage of performance of the PLL is measured in terms of the maximum frequency acquisition range and the time required for signal pull-in. The second mode of PLL operation is termed phase lock which occurs when the VCO frequency and the input signal frequency are equal. Phase lock mode of operation is measured, or evaluated, in terms of PLL performance in the presence of noise. PLL performance in the presence of noise is determined by the closed loop noise bandwidth. Increased closed loop noise bandwidth results in increased PLL susceptibility to noise perturbation. To increase the PLL's frequency acquisition range, the cutoff frequency of the low pass loop filter is increased. However, this has the simultaneous undesirable effect of increasing the closed loop noise bandwidth thus decreasing PLL performance in the phase lock mode of operation. Thus, in prior art PLL systems a compromise between acquisition range and loop noise performance was required in optimizing PLL performance in a particular application.

Various approaches generally classified as either multiple loop systems or multiple mode systems have been proposed to improve performance of PLL systems. Quadricorrelators, swept or dithered VCO systems and frequency phase lock loops with frequency difference discriminators are some examples. These systems frequently do not lend themselves to integration, are often burdened with transitory discontinuities when changing modes, and do not fully achieve the goal of independent control over frequency acquisition and PLL performance characteristics.

A specific approach to improving FPLL performance is disclosed in U.S. Pat. No. 4,072,909 to Citta which discloses an automative phase and frequency control system. Briefly, this system includes two multipliers coupled to the input, or received, signal and to quadrature phase shifting means for phase shifting the output of the VCO to the multiplier combination thus producing a pair of quadrature phase related beat signals together with sum signals. The sum signals are filtered out while the beat signal output of one multiplier is coupled to one input of a third multiplier with the quadrature beat signal of the other multiplier converted by limiter circuitry and a low pass filter to a constant amplitude signal which is provided to the other input terminal of the third multiplier. With the low pass filter possessing a predetermined phase versus frequency characteristic, the filter (and also the limiter) output signal undergoes a phase delay which is a function of the signal frequency. Multiplication of the squared output signal of the limiter and the sinusoidal-like beat signal output of the first multiplier produces an error signal of constant amplitude having a DC component which varies with beat signal frequency. This DC component is then filtered and fed back to the VCO permitting input signal acquisition and normal phase lock operation when the frequencies of the VCO and the input signal are equal resulting in a DC output voltage signal from the limiter. This system represents a substantial improvement in automatic phase and frequency control systems in that substantial independence between signal acquisition and phase lock parameters is achieved.

While a large signal acquisition range and stable phase lock loop operation is attainable in the automatic phase and frequency control system described and claimed in the referenced patent, the degree to which independent control over the frequency acquisition and loop noise performance can be exercised is limited. The feedback signal in this system includes AC components which include harmonics of the beat frequency. As the difference frequency between the input and VCO signals become smaller, the AC loop gain increases with these harmonics increasing in strength. Not only do these beat frequency harmonics increase in amplitude thus producing unwanted sidebands around the VCO center frequency, but the fundamental beat frequency is lost from the VCO control signal. The absence of the fundamental beat frequency is due to the "chopping" effect of the frequency loop multiplier on the beat note signal and limits PLL performance. More specifically, the restriction on the independent control of frequency acquisition and PLL parameters results in the requirement that the residual frequency error of the frequency acquisition part of the system must be less than the lock-in range of the PLL in order for phase lock to occur within one beat cycle.

These and other problems experienced in the above-discussed Citta patent are eliminated in the present invention which is not only capable of being implemented as an IC, but also is capable of improved signal pull-in range and possesses an infinite figure of merit. This is accomplished by the total separation of acquisition and phase lock functions in the frequency and phase lock loop with separated AFC and phase locking of the present invention.

OBJECTS OF THE INVENTION

Accordingly, it is an object of the present invention to provide an improved system for acquiring and locking on to a transmitted RF signal.

Another object of the present invention is to provide an improved signal acquisition and lock-on system with enhanced signal pull-in range.

Still another object of the present invention is to provide an improved frequency and phase lock loop system for acquiring and locking on to a transmitted RF signal.

Still another object of the present invention is to provide an improved frequency and phase lock loop system in which AFC and PLL functions are carried out completely independently.

A further object of the present invention is to provide an improved frequency and phase lock loop system capable of being produced in a single integrated circuit (IC).

A still further object of the present invention is to provide an improved frequency and phase lock loop system in which signal acquisition and pull-in ranges are independent and may be established separately.

BRIEF DESCRIPTION OF THE DRAWINGS

The appended claims set forth those novel features believed characteristic of the invention. However, the invention itself, as well as further objects and advantages thereof will best be understood by reference to the following detailed description of a preferred embodiment taken in conjunction with the accompanying drawings, where like reference characters identify like elements throughout the various figures, in which:

FIGS. 3A-3G and 4A-4G show wave forms of signals at various points within the present invention as shown in FIG. 1 for $f_i > f_o$ and for $f_i < f_o$, respectively, where $f_i$ is the input signal frequency and $f_o$ is the open loop oscillator signal frequency; and FIGS. 5A-5H show the frequency spectrum of signals at various points in the frequency and phase lock loop system with separated AFC and phase locking in accordance with the present invention.

DESCRIPTION OF THE PREFERRED EMBODIMENTS

Figure 1:
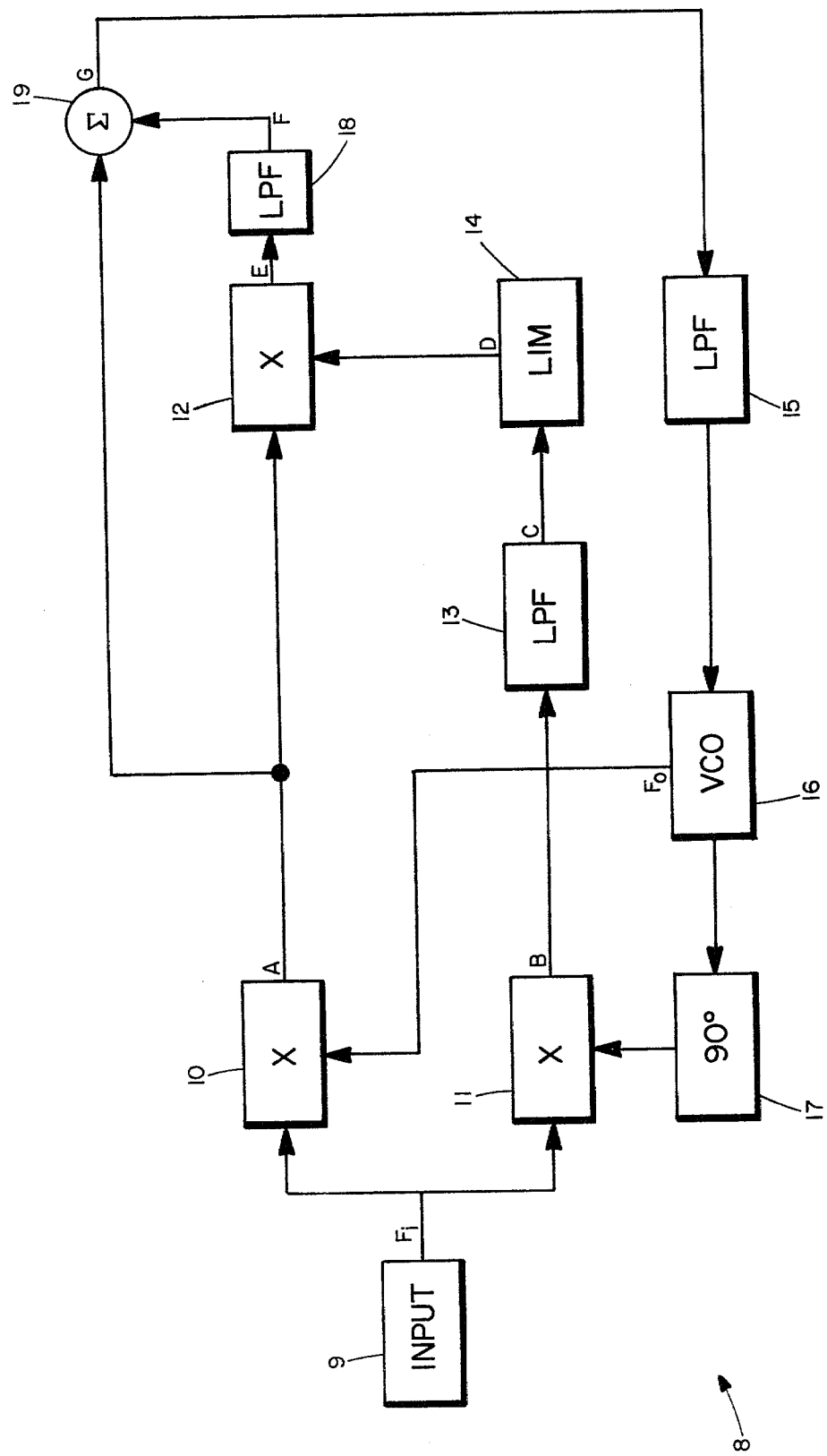
FIG. 1 is a simplified block diagram of one embodiment of a frequency and phase lock loop system with separated AFC and phase locking in accordance with the present invention.

A frequency and phase lock loop system with separated AFC and phase locking in accordance with the present invention is shown in FIG. 1. An input signal with a frequency $f_i$ is coupled to a pair of multipliers 10 and 11. Input stage 9 is comprised of any of the more conventional components typically included in the front end of an RF receiver. For example, included in input stage 9 would be an antenna, a received signal amplifier, a tuner, a mixer, and an IF amplifier. The output signal $f_o$ of a voltage control oscillator (VCO) 16 is coupled to the remaining input terminals of multipliers 10 and 11. A 90° phase shift network 17 is provided between oscillator 16 and multiplier 11. The output of multiplier 10 is coupled to one input of a multiplier 12 while the output of multiplier 11 is coupled to a low pass filter 13 which in turn is coupled to a symmetrical limiter 14. The output of limiter 14 is coupled to the remaining input terminal of multiplier 12. The output of multiplier 12 is coupled via a low pass filter 18 to a signal adder with the output of multiplier 10 provided to the other input terminal of adder 19. The output of adder 19 is coupled via a low pass filter 15 to the control input terminal of voltage control oscillator 16 the output of which is a signal with an open loop output frequency $f_o$.

With the exception of filter 13 and limiter 14 the components of the preferred embodiment of the frequency and phase lock loop system with separated AFC and phase locking as shown in FIG. 1 do not require a detailed explanation. Details of filter 13 and limiter 14 utilized in the preferred embodiment of this invention can be found in U.S. Pat. No. 4,072,909 to Citta. However, it should be obvious that numerous filter and limiter circuits which perform the functions described later can be used without departing from the spirit of the present invention. The operation of the frequency and phase control system 8 shown in FIG. 1 is best understood if discussed in conjunction with FIGS. 3A through 3G and FIGS. 4A through 4G. It is to be noted here that FIGS. 3A-3G and 4A-4G show the situation resulting in a maximum error signal for a 90° phase shift occurring in filter 13. This is done simply for illustrative purposes. Signal multipliers 10 and 11 in response to the input signal $f_i$ and quadrature sample of the output of VCO 16 produce a pair of quadrature phase related frequency difference signal together with sum signals which are removed by filters 13 and 15. While these quadrature beat signals are obtained by inducing a phase shift in an oscillator output it should be obvious that any phase shift in either the oscillator or input signals may be used to produce quadrature beat signals without departing from the spirit of the present invention. The beat signal output of multiplier 10 is directly coupled to one input of multiplier 12 while the quadrature beat signal from multiplier 11 is converted by limiter circuit 14 and low pass filter 13 to a constant amplitude signal. With low pass filter 13 possessing a predetermined phase versus frequency characteristic, the phase delay which occurs within filter 13 (and therefore the phase of the output signal of limiter 14) is a function of the difference frequency.

Multiplication of the "squared" output signal of limiter 14 and the beat signal output of multiplier 10 produces an error signal having a DC component which varies with the beat signal of FIG. 3A. This error signal is provided by multiplier 12 to low pass filter 18 which converts the full wave rectified signal to a DC voltage which is applied to one input of adder 19. Full wave rectification occurs only for the case where a 90° phase shift occurs in LPF 13. To the other input of adder 19 is provided the beat signal output of multiplier 10. Signal adder 19 has the effect of providing the DC level of the AFC loop from multiplier 12 to the beat note frequency of phase lock loop multiplier 10. This permits the DC level acquisition signal to be added to the beat note phase locking signal to provide a correction signal to VCO 16 having acquisition and phase locking characteristics which are completely independent. The output of adder 19 is coupled by filter 15 to VCO 16 to produce both signal acquisition and phase lock of the input signal. Once the VCO frequency $f_o$ and the input signal frequency $f_i$ are equal, the output of limiter 14 becomes a DC voltage while the output of phase detector multiplier 10 maintains phase lock with its output signal being a function of the phase difference between the input signal and the VCO output signal.

A more detailed description of the operation of the present invention is provided by reference to the block diagram of FIG. 1 in combination with the signal waveforms shown in FIGS. 3A-3G and FIGS. 4A-4G. For convenience the individual curves of the figures will be referred to by the figure number in conjunction with the letter of the curve. In addition, the location of the signal waveform of each of the curves is shown by a corresponding letter in the block diagram of FIG. 1 of the frequency and phase lock loop system with separated AFC and phase locking of the present invention. FIGS. 3A–3G depict the signals present within the circuit during acquisition when the input signal, $f_i$, is at a higher frequency than the output signal, $f_o$, of VCO 16. FIGS. 4A–4G depict the signals present within the circuit during acquisition when the output signal, $f_o$, of VCO 16 is at a higher frequency than the input signal, $f_i$. As can be seen from a brief review of the respective figures, this relative difference in frequency results in 180° phase differences and change in sign between the waveforms at various locations in the system for each of the enumerated conditions. Because the principles involved in the basic operation of the system remain the same for both frequency conditions, only FIGS. 3A–3G will be described in detail with that discussion equally applicable to the opposite condition of $f_i < f_o$.

The beat signal outputs of multipliers 10 and 11 are shown in FIGS. 3A and 3B, respectively. It should be noted that a quadrature relationship exists in which the output of multiplier 11 leads that of multiplier 10 by 90°. The signal shown in FIG. 3A is coupled directly to one input of multiplier 12 and that shown in FIG. 3B is applied to low pass filter 13. The output of filter 13, presented in FIG. 3C, shows a 90° lagging phase shift to have occurred within the filter. Similarly, as can be seen in FIG. 4C, because $f_i$ is less than $f_o$ the phase of the output signal of multipler 10 leads the phase of the signal provided to filter 13 by frequency loop multiplier 11. Limiter 14 converts the phase shifted sinusoidal beat signal of FIG. 3C to a substantially amplitude limited periodic signal having the same phase as the waveform in FIG. 3C as depicted in FIG. 3D.

Because $f_i > f_o$ and there is a 90° phase shift lag caused by low pass filter 13, the square wave of FIG. 3D is in phase with the beat signal output of phase lock multiplier 10 shown in FIG. 3A. This phase relationship is due to the phase shift produced by the frequency-dependent phase shift characteristics of low pass filter 13. The conditions shown are of special interest because they represent the maximum error voltage output of the system. The frequency corresponding to this phase condition is determined by the phase shift characteristics of filter 13 and is largely a matter of design choice.

The application of the square wave signal shown in FIG. 3D and the sinusoidal beat signal of FIG. 3A to the inputs of multiplier 12 produces an output signal which is essentially the full wave rectification of the beat signal in FIG. 3A. This waveform, which is shown in FIG. 3E, is then filtered by low pass filter 18 to provide the waveform shown in FIG. 3F which is essentially a DC voltage. The DC voltage signal shown in FIG. 3F is then applied to one input terminal of signal adder 19 while to the other input terminal of adder 19 is applied the phase lock loop beat signal output of multiplier 10. The resultant signal is shown in FIG. 3G in which a sinusoidal variation has been imposed on a DC level signal. The result is that a periodic signal superimposed upon a DC level is provided to VCO 16. This control signal thus includes a large DC level for signal acquisition and a sinusoidal beat signal variation necessary for signal phase lock. This input signal provided to VCO 16 is in contrast to the control signal of the referenced Citta patent in which the sinusoidal beat frequency is "chopped" by the action of the limiter output signal on the beat signal output of the phase lock multiplier. This signal "chopping" results in a loss of the fundamental beat frequency from the output of the phase lock multiplier which limits the Citta system's phase locking capability to the extent the residual frequency error of the AFC has to be less than the lock-in range of the PLL. By retaining the fundamental beat frequency and superimposing it upon the DC signal acquisition level, the present invention provides the phase lock loop with the capability to pull the signal in from its full frequency acquisition range.

Thus, in the present invention the fundamental beat frequency at multiplier 10 is passed to adder 19 and transmitted to VCO 16 producing a sideband which is coherent with the input frequency $f_o$. This sideband output of VCO 16 is, in turn, provided to multiplier 10 which produces a DC component at the output of multiplier 10 which results in the continuation of the frequency acquisition process until phase lock occurs. The PLL portion of the present invention assists frequency acquisition by pulling the VCO during and/or after the AFC portion has pulled it to within its finite residual frequency error. The output of multiplier 12 is filtered by low pass filter 18 and provided to signal adder 19 where it is combined with the beat signal output of phase lock multiplier 10. The resultant waveform is shown in FIG. 3G and it is this signal which is provided to low pass filter 15 in order to produce a DC voltage and the fundamental of the low frequency beat signal suitable for application to the control circuitry within VCO 16.

FIGS. 4A–4G show a set of curves similar to those shown in FIGS. 3A–3G but depicting system performance when the reference frequency is less than that of VCO 16 under maximum error voltage conditions. As expected, system operation remains essentially the same. The primary difference is in the quadrature relationship between the outputs of multipliers 10 and 11 which is reversed to that shown in FIGS. 3A and 3B. The waveforms presented in FIGS. 4A–4G indicate that when the oscillator frequency is greater than that of the input signal, the beat signal produced by a pair of quadrature multipliers is 180° out of phase with the beat signal produced when the frequency relationships are reversed.

Because low pass filter 13 responds only to the frequency of the beat signal and does not respond to the relationship between beat signals, low pass filter 13 again produces a lagging phase shift of 90° yielding the signal shown in FIG. 4C. FIG. 4D shows the constant amplitude signal in phase with that of FIG. 4C produced by the action of limiter 14. Due to the opposite phase relationship between the beat signals of FIGS. 4A–4G and those of FIG. 3A–3G, the constant amplitude signal (shown in FIG. 4D) is 180° out of phase with the beat signal of FIG. 4A and signal multiplication in multiplier 12 results in a similar, but reversed polarity, full wave rectified output signal (shown in FIG. 4E) which when filtered by low pass filter 18 produces the negative voltage "maximum" shown in FIG. 4F. Again, full wave rectification occurs here because of the 90° phase difference between the input and outputs of low pass filter 13. The output of LPF18 is then provided to one input of signal adder 19 to which is also provided the beat signal output of phase lock multiplier 10 shown in FIG. 4A to produce the periodic signal superimposed upon the voltage signal of FIG. 4G. This negative voltage represents the opposite maximum acquisition voltage of the system and possesses a large DC component for signal acquisition in combination with the fundamental beat frequency signal for phase locking.

The frequency difference detection portion of the system, or the AFC system, is made up of frequency difference multiplier 11, low pass filter 13, limiter 14, signal multiplier 12, low pass filter 18, signal adder 19, low pass filter 15, VCO 16, and quadrature phase shifting circuit 17. The output of multiplier 12 is not diminished as frequency lock is obtained but rather becomes a very low frequency signal having a near 0 DC average. This facilitates the phase lock function of the present invention because the point to which the frequency loop pulls the signal to is now within the frequency acquisition range of the phase lock loop due to the presence of the fundamental beat frequency in the control signal provided to VCO 16.

In the phase lock mode of operation the output signals of multipliers 10 and 11 become DC voltages portional to the phase differences between their respective input signals. Since the signals applied to multiplier 10 are substantially in quadrature, a near 0 DC output signal results while the in-phase inputs of multiplier 11 (due to the action of phase shifter 17) cause a near maximum positive or negative output voltage. The output of multiplier 11 is passed by low pass filter 13 causing limiter 14 to apply a positive or negative voltage to one input of multiplier 12. The near 0 output voltage of multiplier 10 is coupled directly to multiplier 12 which couples it substantially unchanged via low pass filter 18 to signal adder 19. Thus, the actions of multiplier 11, low pass filter 13, and signal limiter 14 produce no effect upon the error signal developed by multiplier 10 once acquisition, as evidence by DC output signals from multipliers 10 and 11, is obtained. Multiplier 10, signal adder 19, low pass filter 15, and VCO 16 comprise the phase lock loop portion of the present invention and perform standard APC functions to maintain phase synchronization.

In the present invention the error signal which reflects the difference in phase between the input signal and the VCO 16 is provided by multiplier 10 directly to signal adder 19. The DC voltage level required for signal acquisition from initial frequency errors greater than the PLL pull-in range is provided to signal adder 19 via the AFC loop in which undesirable AC components transmitted by frequency loop multiplier 11, LPF 13 and limiter 14 in conjunction with multiplier 12 are extracted by low pass filter 18. This signal processing arrangement provides for the complete separation of frequency and phase locking functions with signal acquisition performance established primarily by low pass filter 13 and phase lock loop characteristics established by low pass filter 15. The AC beat note is thus passed through adder 19 and low pass filter 15 directly to VCO 18. In addition, in the present system phase detector multiplier 10 performs a multiple function in providing an output signal which represents the phase difference between the input and VCO signals after phase locking occurs, while providing the beat note signal during signal acquisition to frequency multiplier 12 to generate the DC level which represents the frequency difference between the input and VCO signals as well as providing the fundamental of the beat note to adder 19 to further aid in the frequency acquisition process.

The present invention has thus far been described in terms of using a ±1 frequency loop, or baseband multiplier, 12. The operation of this type of signal multiplier is unrestricted as to the sign of both of the input variables. Thus, the waveforms of FIGS. 3A–3G and 4A–4G reflect the operating characteristics of a ±1 baseband multiplier 12. The output of limiter 14 shown in FIG. 3D therefore has both plus and minus components producing a full rectified waveform shown in FIG. 3E as the output of multiplier 12 when combined with the beat signal output of phase lock multiplier 10. FIGS. 4D and 4E similarily show the waveforms for a system incorporating a ±1 frequency loop multiplier 12 for the case of $f_i < f_o$. By differentially weighting the inputs to adder 19 two stable signal acquisition states are possible. If the output of adder 19 depends equally upon the phase loop signal and the frequency loop signal, only one stable acquisition state is possible. In this manner, the loop gains of the phase and frequency loop may be independently varied.

Figure 2:
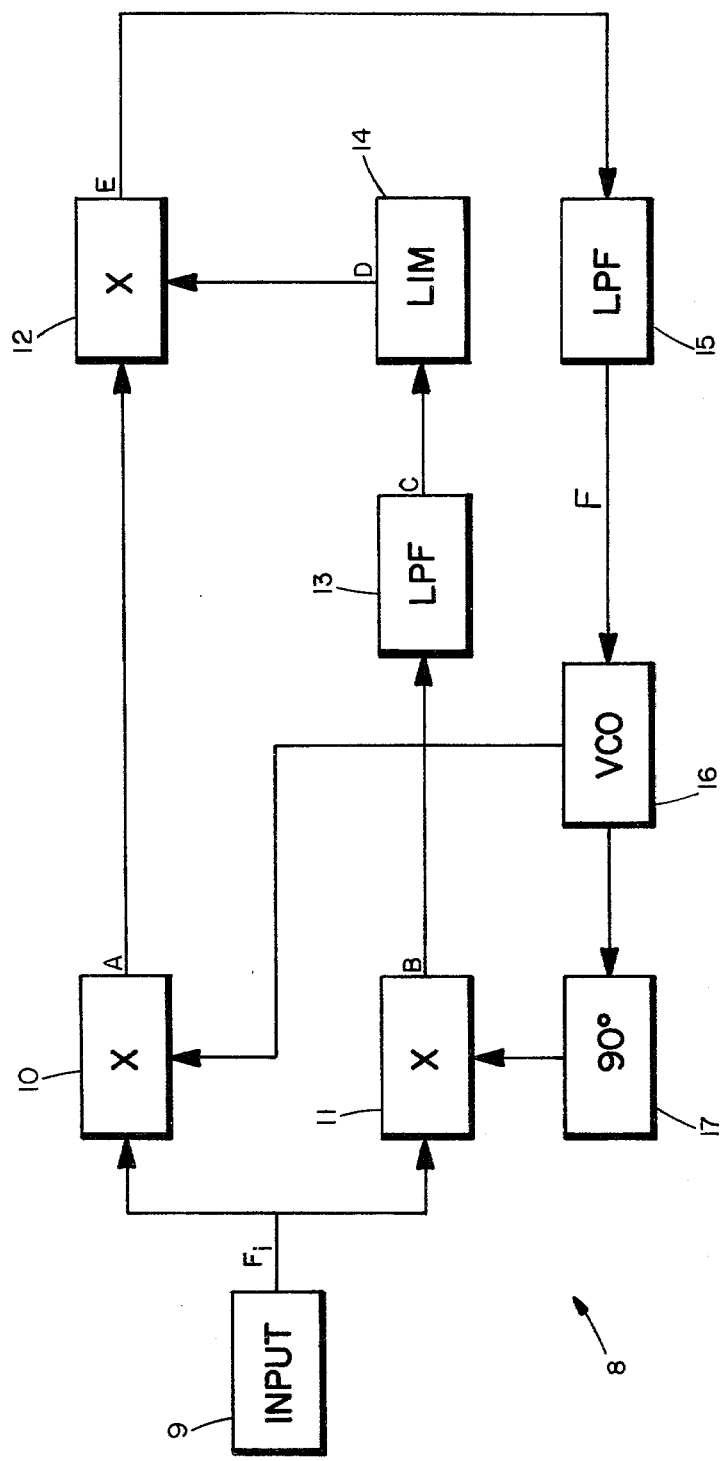
FIG. 2 is a simplified block diagram of another embodiment of a frequency and phase lock loop system with separated AFC and phase locking in accordance with the present invention.

The dotted waveforms shown in FIGS. 3D and 3E, and 4D and 4E show the signal format at corresponding points in the present invention when a 0–1 baseband balanced (i.e. single-balanced) multiplier 12 is utilized in the present invention. FIG. 2 shows a simplified block diagram of the present invention when a 0–1 baseband balanced multiplier 12 is used. Except for effecting AFC loop gain and there being only one stable state, the end result and system performance is unchanged whether a ±1 or 0–1 multiplier is employed. The type of frequency loop multiplier used effects the waveform only at points D and E in the present invention and has no influence on the correction signal provided to VCO 16. The use of a 0–1 frequency loop multiplier thus represents another embodiment of the present invention. The 0–1 multiplier is balanced for the input from limiter 14 but not for the input from phase detector multiplier 10. As the fundamental of the beat frequency is now in the feedback error signal, the pull-in mechanism of the APC loop aides the pull-in of the AFC loop and the system exhibits an increased frequency pull-in range.

Shown in FIGS. 5A–5H is the frequency spectrum at various points in the preferred embodiment of the frequency and phase lock loop system with separated AFC and phase locking. The incoming frequency $f_i$ is shown in FIG. 5A while the open loop VCO frequency $f_o$ is shown in FIG. 5B. FIG. 5C shows the fundamental beat frequency $\Delta f$ of $f_o - f_i$. The open loop beat frequency spectrum at point D is shown in FIG. 5D. This represents the output of ideal limiter 14 to baseband multiplier 12. Only odd harmonics of the beat frequency are present here. The open loop beat frequency spectrum at point E, or at the output of baseband multiplier 12, is shown in FIG. 5E. This represents the frequency spectrum of the fundamental beat frequency multiplied by the output of limiter 14. The fundamental of the original beat frequency is absent here. The open loop beat frequency at point F, following passage of the signal through low pass filter 18, is shown in FIG. 5F and consists essentially of a DC signal provided to signal adder 19. This DC signal represents the frequency acquisition component of the correction signal provided to VCO 16. Adder 19 combines the output of phase detector multiplier 10 and low pass filter 18 to produce the frequency spectrum shown in FIG. 5G. It can be seen that the spectrum includes not only the fundamental beat frequency $\Delta f$ but also a DC frequency acquisition component. FIG. 5H shows the initial closed loop VCO spectrum from which it can be seen that a DC component will be generated at the output of multiplier 10 due to the presence of a spectral component at $f_i$ at both of its inputs. The generation of this DC signal is due to the presence of the fundamental beat frequency $\Delta f$ in the open loop beat frequency signal provided by signal adder 19 to VCO 16. The referenced prior art Citta patent provides a correction signal to the VCO which consists of the frequency spectrum shown in FIG. 5F. It can be seen that the fundamental beat frequency $\Delta f$ is absent from this output signal and because of the absence of the fundamental beat frequency the initial closed loop VCO spectrum of the Citta system also is without a $\Delta f$ component and a DC correction signal for VCO 16. Consequently, the spectrum in the Citta system lacks a component at $f_i$ and, without the fundamental beat frequency present in the feedback loop, the output of multiplier 10 is without a DC correction signal for VCO 16. The absence of the fundamental beat frequency component is due to the chopping effect of the frequency loop multiplier in the Citta system and results in an AC signal feedback to the VCO which limits system phase lock performance due to instabilities caused by the AC feedback signal.

There has thus been shown a frequency and phase lock loop system and method with separated AFC and phase locking which provides for the independent establishment of signal acquisition range and close loop bandwidth performance parameters. This system and method also offers increased signal acquisition range and the advantages of an integrated circuit design.

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention.

The matter set forth in the foregoing description and accompanying drawings is offered by way of illustration only and not as a limitation. The actual scope of the invention is intended to be defined in the following claims when viewed in their proper perspective against the prior art.

We claim:

1. An automatic phase and frequency control system for producing phase and frequency synchronization between a locally generated signal and an input signal comprising;

voltage controlled oscillator means producing said locally generated signal having a frequency responsive to a control signal;

signal generating means producing first and second beat signals between said input signal and said locally generated signal, said beat signals having a substantially quadrature relationship;

translating means converting said first beat signal to a constant amplitude signal having a phase relative to said second beat signal which varies in a predetermined relationship to the frequency of said first beat signal, said translating means being capable of coupling a DC signal;

multiplying means multiplying said second beat signal from said signal generating means and the output signal of said translating means to develop a composite correction signal, said multiplying means including a single-balanced signal multiplier capable of receiving signals of a single sign from said signal generating means and said translating means; and low pass filter means coupling said composite correction signal to the control signal input of said voltage controlled oscillator, said composite correction signal including the fundamental beat note frequency of said input signal and said locally generated signal.

* * * * *